United States Patent [19]

Koehler et al.

[11] 3,754,152

[45] Aug. 21, 1973

[54] INCREMENTALLY ADJUSTABLE CAPACITOR UNIT FOR TUNING A CRYSTAL-CONTROLLED OSCILLATOR

[75] Inventors: Dale R. Koehler, Westwood; William W. Mutter, Paramus, both of N.J.

[73] Assignee: Bulova Watch Company, Inc., New York, N.Y.

[22] Filed: Nov. 3, 1971

[21] Appl. No.: 195,348

[52] U.S. Cl. .............. 310/8.1, 317/249 R, 317/261, 318/118, 331/116, 331/158

[51] Int. Cl. ............................................. H01v 7/00

[58] Field of Search ................. 310/8, 8.1; 331/116, 331/139, 159, 158, 160; 318/116, 118; 317/249 R, 261

[56] References Cited

UNITED STATES PATENTS

| | | | |
|---|---|---|---|
| 3,100,886 | 8/1963 | Marks | 310/8.1 X |
| 3,235,817 | 2/1966 | Stapelfeldt | 33/116 R |
| 3,447,051 | 5/1969 | Attwood et al. | 318/118 X |
| 2,960,691 | 11/1960 | Wolfe | 310/8.1 X |
| 3,400,312 | 9/1967 | Dornfeld et al. | 317/249 R |
| 3,586,933 | 6/1971 | Bonini | 317/261 |
| 3,379,943 | 4/1968 | Breedlove | 317/261 X |
| 3,273,033 | 9/1966 | Rossmeisl | 317/261 X |

*Primary Examiner*—J. D. Miller
*Assistant Examiner*—Mark O. Budd
*Attorney*—Michael Ebert

[57] ABSTRACT

A capacitor unit adapted to adjust the frequency of a crystal-controlled oscillator in incremental steps, the oscillator serving as a frequency standard for an electronic timepiece. The unit is constituted by a bank of capacitors whose respective values fall into a binary series, each capacitor being associated with a switch arranged to connect the capacitor in parallel relation to the other capacitors in the bank, whereby the reactance presented by the unit may be varied incrementally by selective operation of the switches to create a reactance range whose lowest value is determined by the smallest capacitor alone, whose highest value is determined by the sum of all the capacitors in the bank, and whose intermediate values are determined by the capacitors singly or in shunt combinations thereof.

6 Claims, 6 Drawing Figures

INCREMENTALLY ADJUSTABLE CAPACITOR UNIT FOR TUNING A CRYSTAL-CONTROLLED OSCILLATOR

BACKGROUND OF THE INVENTION

This invention relates generally to adjustable crystal-controlled oscillators, and more particularly to a capacitor unit associated with a crystal oscillator and adapted to tune the frequency thereof in incremental steps.

In order to provide an electronic timepiece of high accuracy, it is known to derive periodic pulses at a low repetition rate from a frequency-divider coupled to a stable, high-frequency standard, the pulses serving to actuate a suitable time display. The frequency standard or time base is generally in the form of a piezoelectric crystal-controlled oscillator whose resonant frequency in electronic timepieces usually lies in a range about 10,000 to 35,000 Hz.

The time display is adapted to indicate time in terms of seconds, minutes and hours, and it is therefore necessary to divide down the frequency of the crystal-controlled time base to a low rate suitable for the associated display. This display may be of the conventional mechanical type employing time indicating hands or in the form of non-mechanical electroluminescent or electro-optical elements adapted to afford time indications.

Thus, in patent 3,540,209 of Zatsky, et al., an electronic timepiece is disclosed wherein pulses at a rate of one per second are generated, the pulses serving to actuate a liquid-crystal display for indicating the passage of time. For this purpose, use is made of a crystal-controlled oscillator operating at a frequency of 32,768 Hz, the output of the oscillator being applied to a chain of 15 binary divider stages yielding an output of exactly one pulse per second.

In the Schaller U.S. Pat. No. 3,282,042, the frequency of a crystal-controlled oscillator is divided down to produce a 360 Hz pulsatory output for synchronizing the operation of a tuning-fork resonator driving the gear works of a mechanical time display. In the Nakai U.S. Pat. No. 3,212,252, the output of a crystal oscillator is supplied to a frequency divider, and then amplified so as to energize a synchronous motor which drives a conventional time display mechanism.

Thus, various forms of mechanical and non-mechanical time displays have heretofore been used in conjunction with a stable, high-frequency, crystal-controlled time base functioning in combination with a frequency divider to reduce the timing frequency to a rate appropriate to the display.

The crux of the timepieces disclosed in the above-noted patents lies in the crystal-controlled oscillator. This high-Q oscillator not only has the advantage of being inherently more stable than other species of frequency standards, but it is further characterized by an insensitivity to position error. When, therefore, the timepiece is in the form of a wrist watch, the frequency of the standard and hence the timing of the watch, is not adversely affected by changes in attitude.

A conventional crystal-controlled timepiece is a precise timekeeper only if the crystal is dimensioned to function at an assigned frequency. Thus, in one of the examples previously given, one pulse per second for actuating the display, is produced by dividing down the output of a crystal oscillator operating at a frequency of exactly 32,768 Hz. Should the crystal frequency be displaced from this particular value, the timepiece will be inaccurate to an extent depending on the degree of displacement. An error of only one part in 10,000 in the crystal frequency will give rise to a timekeeping error of about 10 seconds a day or 5 minutes a month. This error, under modern standards of accuracy for electronic watches, is unacceptable.

Assuming that the frequency divider in the timekeeping system is an invariable element, the only means for assuring precise timekeeping is to provide a crystal operating at the assigned frequency. Though it is possible to manufacture crystals at a predetermined frequency, the processes involved are elaborate and costly. Highly traimed personnel are required to carry out the techniques entailed in exactly dimensioning a crystal so that it operates at an assigned frequency.

In mass producing electronic timepieces, it is not feasible to require crystals operating precisely at an assigned frequency, for the expenses entailed in making such crystals are such as to raise production costs to a prohibitive level.

Inasmuch as the resonant frequency of a crystal-controlled oscillator is a function of the reactance of the circuit, one may effect slight changes in the oscillator's frequency in a direction above or below the natural frequency of the crystal by means of a variable reactance or group of incrementally adjustable reactors in series with the crystal. From a consideration of physical size, it is presently possible to construct an incrementally adjustable capacitor as a reactor unit smaller than a continuously adjustable unit.

In a crystal-controlled watch, the movement must include a crystal oscillator, a frequency divider and some form of time display. Consequently, there is very little space available in the confines of the watch casing for an incrementally adjustable capacitor unit to tune the crystal oscillator.

The main difficulty heretofore experienced with incrementally adjustable capacitors where the minimum incremental adjustment in capacitance is fixed is that to provide a large number of incremental steps in order to effect precise timing entails a large number of capacitors, an equal number of switches to connect the capacitors into the circuit, and external leads therefor. When, because of space limitations, it becomes necessary to reduce the number of elements in the capacitor unit to meet these limitations, then the resultant range of adjustment is insufficient to tune the crystal oscillator to a frequency setting affording precise timing.

SUMMARY OF THE INVENTION

In view of the foregoing, it is the primary object of this invention to provide an incrementally-adjustable capacitor unit having a broad reactance range and capable of selectively presenting a large number of capacitance values, using a relatively small number of capacitors, switches and connecting leads for this purpose.

A salient advantage of a unit in accordance with the invention is that because it is highly compact, it lends itself to inclusion in the movement of a crystal-controlled watch, the unit being adapted to tune the crystal oscillator precisely to an assigned frequency.

More particularly, it is an object of this invention to provide an incrementally-adjustable capacitor unit in which a bank of capacitors is associated with an equal number of switches, all of the capacitors in the bank being created on a common chip.

Also, an object of the invention is to provide a unit having a chip of the above type, which chip is joined to a printed circuit board having an underlying metal base plate, the board affording printed connections between the capacitors on the chip and switching screws threadably received in the base plate, each screw completing a connection to the plate only when it engages the associated printed connection.

Yet another object of this invention is to provide a capacitor unit constituted by a bank of capacitors, a row of switches and connections between the switches and capacitors, all elements forming this unit being supported on a single miniature circuit board to afford a self-contained unit having two output terminals which may readily be connected to a crystal oscillator.

Briefly stated, these objects are accomplished in an incrementally adjustable capacitor unit composed of a bank of capacitors whose values lie in a binary ratio series, and an equal number of switches, each switch being connected in a series circuit with a respective capacitor in the bank, the several series circuits being connected in parallel relation, whereby the output capacitance presented by the unit may be adjusted by selective operation of the switches so that it is equal to that of any one capacitor in the bank or to the sum of two or more capacitors in the bank. The reactance range of the capacitance of the unit extends in uniform increments from the value of the smallest capacitor in the bank to a maximum value equal to the sum of all the capacitors in the bank.

The circuit is adapted to operate in conjunction with a crystal controlled oscillator. The smallest capacitor value in the circuit is chosen to satisfy the frequency adjustment tuning resolution requirement, whereas the sum of all values in the binary series is such as to satisfy the total range of frequency adjustment requirement.

The unit is preferably constructed so that the bank of capacitors is created on a single chip having a dielectric layer formed on a common electrode and a plurality of separate electrode areas formed on the dielectric layer, the dimensions of the areas being such as to define the respective capacitor values in the binary series. The chip is joined to a printed circuit board having screw switches thereon as well as connections to the capacitors in the bank. The overall dimensions of the unit are such that it may readily be included in the watch casing of a crystal-controlled electronic timepiece.

OUTLINE OF THE DRAWINGS

For a better understanding of the invention as well as other objects and further features thereof, reference is made to the following detailed description to be read in connunction with the accompanying drawings, wherein.

DESCRIPTION OF THE INVENTION

Figure 1:
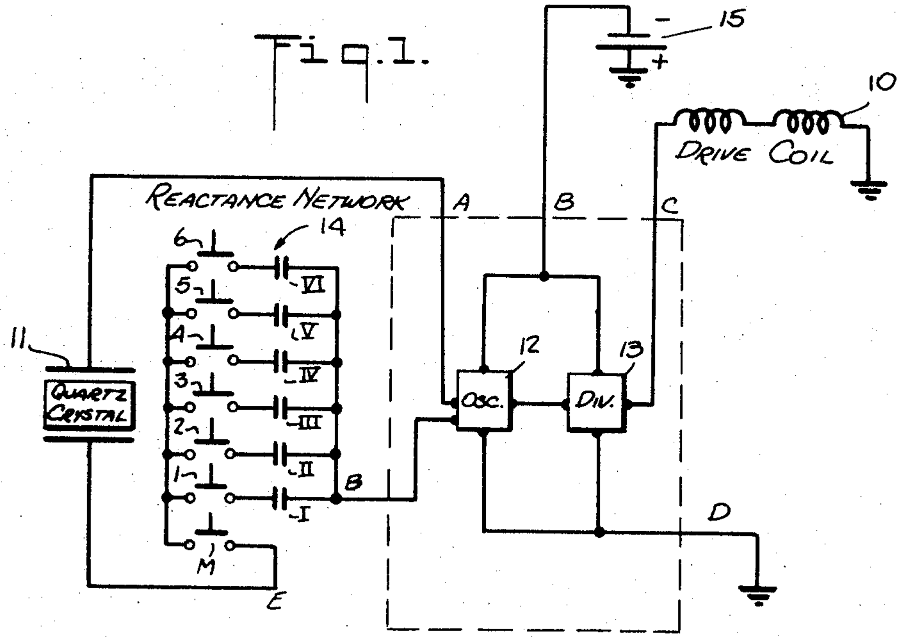
FIG. 1 is a circuit diagram of a crystal-controlled timepiece including an incrementally adjustable capacitor unit in accordance with the invention.

Referring now to FIG. 1, there is shown an electric timepiece in accordance with the invention generally of the type disclosed in the above-identified patents, in which the output of a high-frequency or stable crystal oscillator is divided down to produce low frequency timing pulses for operating a suitable time display. By way of example, we shall assume a mechanical time display having hands which are driven through a gear works operated by a tuning fork motor of the type disclosed in said Schaller patent; the vibrations of the fork being converted to rotary motion.

However, instead of having a self-sufficient transistor drive circuit for sustaining the fork in vibration, as in the Schaller patent or as in Hetzel U.S. Pat. No. 2,971,323, the tuning fork is actuated by drive pulses derived from the crystal-controlled oscillator and applied to the drive coils 10 at a rate appropriate to the resonant frequency of the tuning fork.

Alternatively, dirve coils 10 may be the coils of a stepping motor or any other electromagnetic device for operating a mechanical time display. It is to be understood that the pulses applied to drive coil 10 need not be used for actuating a mechanical time display, but may be employed to activate an electronic time display.

The stable frequency standard is provided by a piezoelectric quartz crystal 11 in circuit with an oscillator 12 to produce a high-frequency signal which is applied to a frequency divider 13 having an appropriate number of stages to produce low frequency pulses at a rate suitable for the associate time display. The operating frequency of oscillator 12 is tuned by an incrementally adjustable reactance network forming a capacitor unit generally designated by numeral 14. The entire system is powered by a suitable battery 15.

Figure 2:
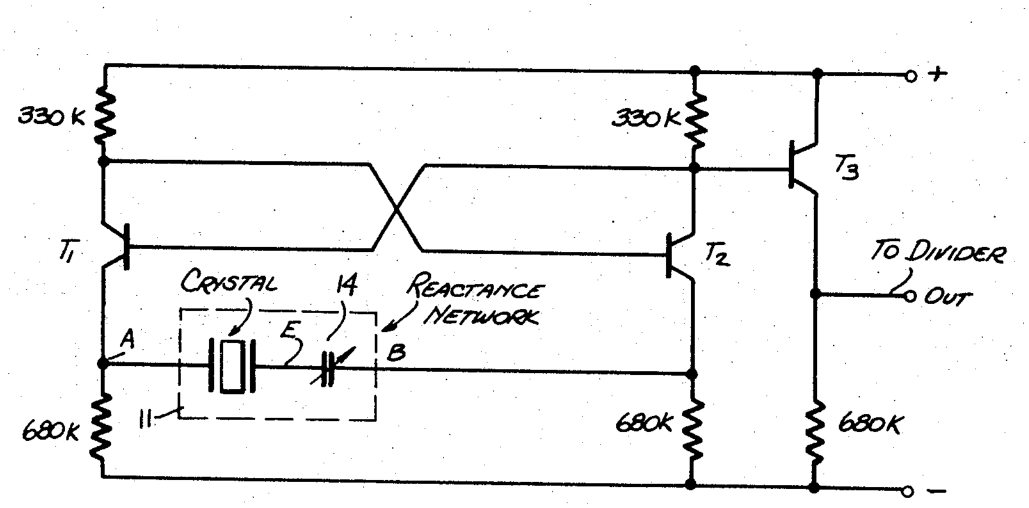
FIG. 2 is the schematic circuit diagram of the crystal oscillator including the adjustable capacitor unit.

As shown in FIG. 2, oscillator 12 is constituted by two cross-coupled transistors $T_1$ & $T_2$ in a flip-flop arrangement, the crystal 11 and the capacitor unit 14 in series therewith being connected between the emitters of the two transistors. The pulses produced by the flip-flop circuit are at a rate determined by the natural frequency of the crystal and the reactance introduced by the unit which serves to slightly modify the oscillator rate to an extent determined by the value of the reactance introduced in the circuit. The pulses produced at the collector of transistor $T_2$ are applied to the base of amplifying transistor $T_3$, whose output appears relative to ground at terminal 16 which is connected to the input of divider 13.

The incrementally adjustable capacitor unit 14 is composed of a bank of capacitors whose values lie in a binary ratio series, the smallest capacitance value being designed to satisfy the required frequency adjustment resolution, and the capacitance sum of which satisfies the required total range of frequency adjustment.

That is, if $C_A$ is such that when combined in circuit with the crystal, the oscillator frequency is shifted by an amount equal to a predetermined frequency range, then the value of $C_A$ may be expressed by the following equation:

$$C_A = \sum_{n=1}^{m} C_n, \text{ where } C_{n+1}/C_n = 2,$$

and wherein $C_1$ is of such value that when used in the oscillator circuit with the crystal, a frequency shift is effected which is equal to the resolution value desired of the frequency regulating element.

In the example shown in the drawings, the binary ratio series of capacitors forming the unit in FIG. 1 is composed of capacitors I, II, III, IV, V and VI, whose respective values are 0.5, 1, 2, 4, 8 and 16 picofarads. Thus, each picofarad value in the binary series is twice that of the preceding value, the lowest value, one-half a picofarad satisfying the required frequency adjustment resolution. The sum of the values, which is 31 and ½ picofarads, satisfies the required total range of frequency adjustment.

The capacitors are each connected in a simple series circuit with a make or break switch, which series circuits are connected in parallel. Hence when the associated switch is closed, the capacitor is connected in parallel with the other capacitors whose switches are closed. Thus, capacitor I is connected in series with switch 1, capacitor II with switch 2, capacitor III with switch 3, capacitor IV with switch 4, capacitor V with switch 5 and capacitor VI with switch 6. The parallel network formed by these capacitors and switches is connected between output points B&E by a master switch M.

Utilizing an inexpensive MOS technology for fabricating the capacitors in the network, each capacitor in the binary series may be defined by a conductive area of appropriate size on the top face of a thin dielectric layer formed on a planar conductive body, the body constituting an electrode common to the separate electrodes formed by the conductive areas on the top face of the dielectric layer.

The capacitance values in the range are obtained by connecting in shunt relation one or more of the capacitors in the bank. The value $C_A$ is obtained only when all of the capacitors are connected in parallel. Conversely stated, if a given frequency adjustment resolution value is desired which is satisfied by the smallest capacitor value $C_1$, and if a total frequency range of adjustment is given and a given number of incremental steps is desired, the binary series capacitor unit satisfies these requirements within a minimum space, thereby making possible an optimally small unit.

In the following table, we shall show the large number of incremental one-half picofarad steps which are available using a network formed by only six capacitors (0.5–1–2–4–8–16 picofarads) whose values constitute a binary series. It will be seen that some values are attained by using only one of the capacitors in the bank, and others by a selected combination of the capacitors.

| Step No. | Network Capacitance | Capacitor Value in Circuit |
|---|---|---|
| 1 | ½ | ½ |
| 2 | 1 | 1 |
| 3 | 1 ½ | ½ + 1 |
| 4 | 2 | 2 |
| 5 | 2 ½ | ½ + 2 |
| 6 | 3 | 1 + 2 |
| 7 | 3 ½ | ½ + 1 + 2 |
| 8 | 4 | 4 |
| 9 | 4 ½ | ½+ 4 |
| 10 | 5 | 1 + 4 |
| 11 | 5 ½ | ½+ 1 + 4 |
| 12 | 6 | 2 + 4 |
| 13 | 6 ½ | ½+ 2 + 4 |
| 14 | 7 | 1 + 2 + 4 |
| 15 | 7 ½ | ½+ 1 + 2 + 4 |
| 16 | 8 | 8 |
| 17 | 8 ½ | ½+ 8 |
| 18 | 9 | 1 + 8 |
| 19 | 9 ½ | ½ + 1 + 8 |
| 20 | 10 | 2 + 8 |
| 21 | 10 ½ | ½ + 2 + 8 |
| 22 | 11 | 1 + 2 + 8 |
| 23 | 11 ½ | ½ + 1 + 2 + 8 |
| 24 | 12 | 4 + 8 |
| 25 | 12 ½ | ½ + 4 + 8 |
| 26 | 13 | 1 + 4 + 8 |
| 27 | 13 ½ | ½ + 1 + 4 + 8 |
| 28 | 14 | 2 + 4 + 8 |
| 29 | 14 ½ | ½ + 2 + 4 + 8 |
| 30 | 15 | 1 + 2 + 4 + 8 |
| 31 | 15 ½ | ½ + 1 + 2 + 4 + 8 |
| 32 | 16 | 16 |
| 33 | 16 ½ | ½ + 16 |
| 34 | 17 | 1 + 16 |
| 35 | 17 ½ | ½ + 1 + 16 |
| 36 | 18 | 2 + 16 |
| 37 | 18 ½ | ½ + 2 + 16 |
| 38 | 19 | 1 + 2 + 16 |
| 39 | 19 ½ | ½ + 1 + 2 + 16 |
| 40 | 20 | 4 + 16 |
| 41 | 20 ½ | ½ + 4 + 16 |
| 42 | 21 | 1 + 4 + 16 |
| 43 | 21 ½ | ½ + 1 + 4 + 16 |
| 44 | 22 | 2 + 4 + 16 |
| 45 | 22 ½ | ½ + 2 + 4 + 16 |
| 46 | 23 | 1 + 2 + 4 + 16 |
| 47 | 23 ½ | ½ + 1 + 2 + 4 + 16 |
| 48 | 24 | 8 + 16 |
| 49 | 24 ½ | ½ + 8 + 16 |
| 50 | 25 | 1 + 8 + 16 |
| 51 | 25 ½ | ½ + 1 + 8 + 16 |
| 52 | 26 | 2 + 8 + 16 |
| 53 | 26 ½ | ½ + 2 + 8 + 8 + 16 |
| 54 | 27 | 1 + 2 + 8 + 16 |
| 55 | 27 ½ | ½ + 1 + 2 + 8 + 16 |
| 56 | 28 | 4 + 8 + 16 |
| 57 | 28 ½ | ½ + 4 + 8 + 16 |
| 58 | 29 | 1 + 4 + 8 + 16 |
| 59 | 29 ½ | ½ + 1 + 4 + 8 + 16 |
| 60 | 30 | 2 + 4 + 8 + 16 |
| 61 | 30 ½ | ½ + 2 + 4 + 8 + 16 |
| 62 | 31 | 1 + 2 + 4 + 8 + 16 |
| 63 | 31 ½ | ½ + 1 + 2 + 4 + 8 + 16 |

From the foregoing table, it will be evident that with a binary series of only six capacitors, the lowest individual value, which is 0.5 picofarads and the highest individual value, which is 16 picofarads, one is able to operate from the lowest individual value to the highest combined value (31.5 picofarads) in 63 incremental steps. These steps are effected simply by closing one or more or six switches 1 to 6, all six switches being closed only in step 63 to produce the highest combined value.

Figure 3:
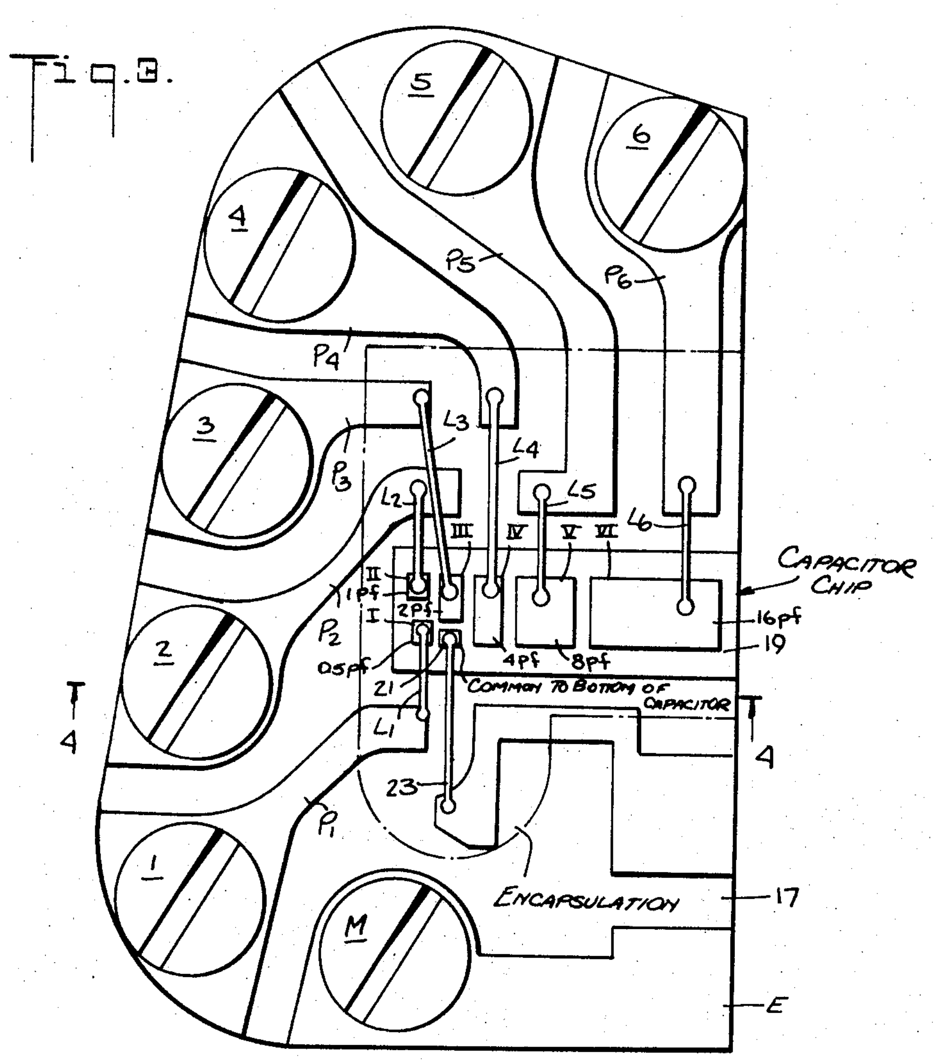
FIG. 3 is a plan view of an adjustable capacitor unit in accordance with the invention.
Figure 4:
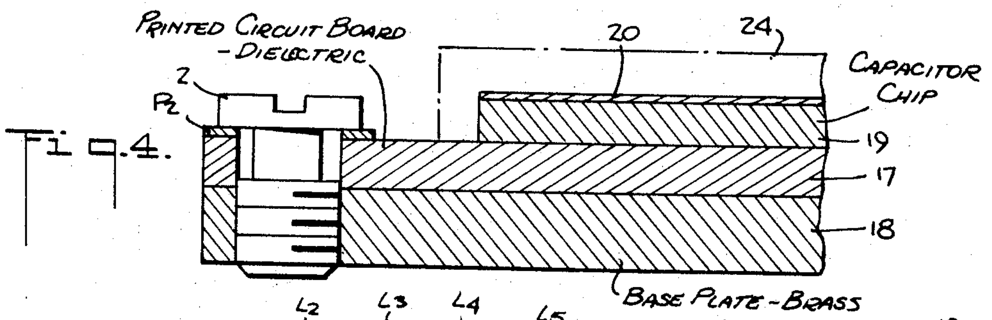
FIG. 4 is a section taken in the transverse plane indicated by line 4—4 in FIG. 3.
Figure 5:
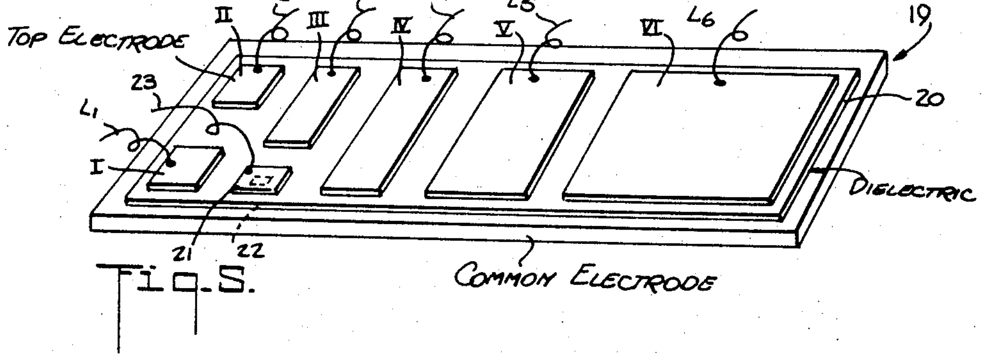
FIG. 5 is a perspective view of the capacitor chip.

Referring now to FIGS. 3 to 6, there is shown a preferred embodiment of an incrementally adjustable capacitor unit 14 which incorporates the switching and capacitor elements on the network shown in FIG. 1. The unit is constituted by a non-conductive printed circuit board 17, superposed on a conductive base plate 18 which may be made of brass or other metal of acceptable structural and electrical properties. Mounted on printed circuit board 17 is a small capacitor chip 19 which is fabricated as shown in FIG. 5, to incorporate the various capacitors in the bank forming the binary series.

Chip 19, is formed of a conductive body which constitutes the common electrode and a thin dielectric layer 20 on the top face of body 19, the upper face of dielectric layer 20 being plated with separated conductive areas whose dimensions are such as to define with the common body electrode 19, the six capacitors I, II, III, IV, V and VI, whose values form the binary series.

In practice, the capacitors may be made using a chip of silicon material of low resistivity, the surface thereof being steam-treated to form a silicon dioxide dielectric layer of almost molecular thinness, this layer being plated to define the various electrodes.

A connection between the top electrodes of capacitors I to VI is made by printed circuit connections $P_1$, $P_2$, $P_3$, $P_4$, $P_5$, and $P_6$, to switches 1 to 6 respectively, which take the form of simple screws. These screws, as best seen in FIG. 4, pass through the board and are threadably received in base plate 18.

Printed circuit connections $P_1$ to $P_6$, are linked at one end by bonding leads $L_1$ to $L_6$ to the respective top electrodes I to VI on the capacitor chip, the other end of the connections lying under the head of switching screws 1 to 6. Hence when a screw is turned out, the switch is open and when it is turned into engagement with the associated printed circuit connection, the switch is closed and acts to shunt the related capacitor into the parallel network.

The connection to common body electrode 19 is made by means of a small conductive area 21 plated on the top face of the dielectric layer 20 on the chip and connection by an internal lead 22 to the common body electrode 19. Area 21 is connected by an external lead 23 to printed circuit connection B. The master switch screw M on the circuit board engages printed circuit connection E. The chip is protectively encapsulated on the board by a coating 24 which also overlies all connecting leads $L_1$ to $L_6$ going to the printed circuit connections.

Thus, the unit shown in FIG. 3 has two output terminals B & E and it presents an output capacitance whose value is determined by the selective operation of switching screws 1 to 6. The master screw M serves primarily to form a connection to base plate 18 and need not be turned out unless one desires to disconnect the entire network.

Figure 6:
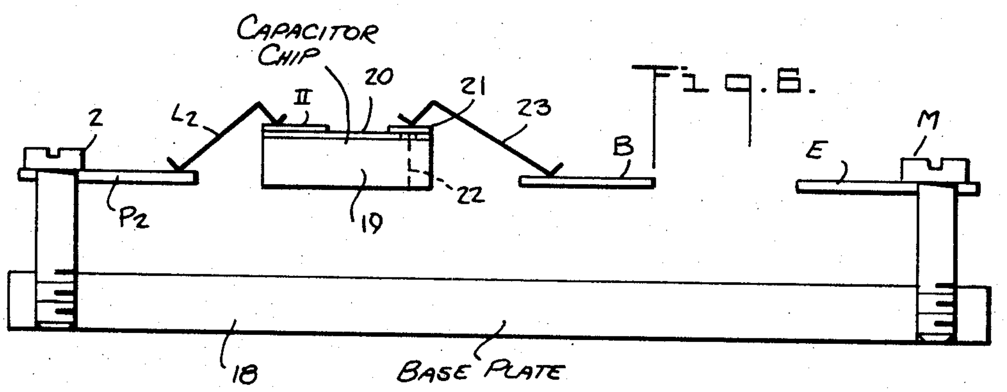
FIG. 6 is a schematic diagram showing the manner in which the capacitor chip is connected to the crystal oscillator.

The operation of the network is shown schematically in FIG. 6, where it will be seen that the top electrode of capacitor II is connected via lead $L_2$, printed circuit connection $P_2$, and switch screw 2 to base plate 18, and from there via master screw M to output connection E. The common body electrode 19 is connected via internal lead 22 going to top face electrode 21 and lead 23 to output connection B. Thus, the value of capacitor II is presented between output terminals B & E which in turn are connected in series with the crystal in the manner shown in FIG. 1.

It will be appreciated that the capacitor unit which is highly compact thanks to the binary series of capacitor values, nevertheless makes possible a large number of incremental changes using the smallest number of switches and connections. The invention is of course, not limited to a binary series of six values, and a greater or smaller binary series may be used.

While there has been shown a preferred embodiment of an incrementaly adjustable capacitor unit for tuning a crystal-controlled oscillator, in accordance with the invention, it will be appreciated that changes and modifications may be made within the scope of the invention.

We claim:

1. In combination with a crystal-controlled oscillator, an incrementally adjustable capacitor unit for tuning the crystal oscillator throughout a relatively broad total range to a desired value, in minute steps each of which produces a like incremental change in the frequency of the oscillator said unit comprising:

a. a bank of capacitors having a predetermined number of capacitors whose respective values are in a binary ratio series, the smallest capacitor value in the bank being chosen to satisfy the required frequency adjustment resolution, the sum of all values in the series satisfying the required total range of frequency adjustment, and b. selective switching means for connecting the capacitors in said bank in parallel relation to produce an output capacitance whose lowest value is equal to the value of the smallest capacitor, whose highest value is equal to the sum of the capacitor values and whose intermediate values depend on which switching means are operative, said switching means being constituted by a group of switches equal in number to the number of said capacitors, each switch in the group being connected in series with a corresponding capacitor in the bank to produce a series circuit therewith, the series circuit formed by the bank of capacitors and the group of switches being connected in parallel relation to said crystal oscillator whereby said oscillator is tunable throughout said total range in equi-spaced steps running from the lowest to the highest frequency in the range, the magnitude of each step being equal to the change in frequency produced by the smallest capacitor value in the bank, said capacitors being constituted by a dielectric layer formed on a conductive chip body, the conductive body forming a common rear face electrode, with separated front face electrodes whose dimensions determine the capacitance values in said binary series, said chip being mounted on a printed circuit board having a conductive base plate, said circuit board having conductive connections leading to said front face electrodes, said group of switches being formed by switching screws extending through the printed board and threadably received in said base plate, said screws, when fully extended, acting to engage said conductive connections to complete a circuit to the base plate.

2. A unit as set forth in claim 1, wherein said series is composed of capacitors having the values of 0.5, 1, 2, 4, 8 and 16 picofarads.

3. A unit as set forth in claim 1, further including an additional front face electrode internally connected to the common electrode to provide a front face connection to the common electrode.

4. A unit as set forth in claim 1, wherein said chip is encapsulated on said board.

5. A crystal-controlled oscillator in combination with a capacitor unit, as set forth in claim 1, wherein said oscillator functions as the frequency standard of an electronic watch, which includes a frequency divider to derive low frequency timing pulses from said oscillator.

6. The combination set forth in claim 1, wherein said pulses are applied to the drive coil of a tuning fork motor for operating time indicators.

* * * * *

UNITED STATES PATENT OFFICE
CERTIFICATE OF CORRECTION

Patent No. 3,754,152 Dated August 21, 1973

Inventor(s) Dale R. Koehler and William W. Mutter

It is certified that error appears in the above-identified patent and that said Letters Patent are hereby corrected as shown below:

Claim 1, Column 8, line 20 "circuit" second occurrence should read -- circuits --.

Signed and sealed this 29th day of January 1974.

(SEAL)
Attest:

EDWARD M.FLETCHER,JR.
Attesting Officer

RENE D. TEGTMEYER
Acting Commissioner of Patents